(12) United States Patent
Paillet et al.

(10) Patent No.: US 7,215,173 B2
(45) Date of Patent: May 8, 2007

(54) LOW-SWING LEVEL SHIFTER

(75) Inventors: Fabrice Paillet, Hillsboro, OR (US); David J. Rennie, Etobicoke (CA); Tanay Karnik, Portland, OR (US); Jianping Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 11/047,442

(22) Filed: Jan. 31, 2005

(65) Prior Publication Data

US 2006/0170481 A1 Aug. 3, 2006

(51) Int. Cl.
*H03L 5/00* (2006.01)

(52) U.S. Cl. .................. 327/333; 327/108; 326/82
(58) Field of Classification Search .......... 327/112, 327/108, 333; 326/82, 83
See application file for complete search history.

(56) References Cited

U.S. PATENT DOCUMENTS

| | | | | |
|---|---|---|---|---|
| 5,216,297 A | * | 6/1993 | Proebsting | 326/73 |
| 5,900,745 A | * | 5/1999 | Takahashi | 326/64 |
| 6,005,438 A | * | 12/1999 | Shing | 330/253 |
| 6,111,431 A | * | 8/2000 | Estrada | 326/83 |
| 6,218,884 B1 | * | 4/2001 | Chiu | 327/376 |
| 6,552,581 B1 | * | 4/2003 | Gabara | 327/108 |
| 6,552,582 B1 | * | 4/2003 | Bryan et al. | 327/108 |
| 6,975,141 B2 | * | 12/2005 | Mueller et al. | 326/83 |
| 2005/0088202 A1 | * | 4/2005 | Koto | 326/81 |

* cited by examiner

*Primary Examiner*—Long Nguyen
*Assistant Examiner*—Ryan Jager
(74) *Attorney, Agent, or Firm*—Douglas J. Ryder; Ryder IP Law, PC

(57) ABSTRACT

In general, in one aspect, the disclosure describes an apparatus for shifting a low swing signal. The apparatus includes a first pair of transistors to receive a first input signal and a second input signal and to generate a first output signal that is a shifted version of the first input signal. The apparatus further includes a second pair of transistors to receive the first input signal and the second input signal and to generate a second output signal that is a shifted version of the second input signal.

2 Claims, 9 Drawing Sheets

LOW-SWING LEVEL SHIFTER

BACKGROUND

Voltage signals have an upper limit and a lower limit and a voltage swing therebetween. Circuits may be designed to work with high or low voltages, may be designed for high or low swings, may be designed to work near a saturation region or in the saturation region. The lower the swing the faster that processing can occur. Often the swing of a signal is sufficient but the upper or lower parameters of the signals need to be adjusted. For example, the signal may need to be shifted up or down so that a transistor receiving the signal operates in the saturation region. Shifting a signal entails maintaining the swing (absolute voltage drop) of the signal while moving upper and lower limits of the signal.

Devices for shifting the current may be complex or may be based on current drawn by a load connected to the shifting device. Relying of the current drawn by the load requires excess power consumption. If the load is modified then the current drawn may be modified and the voltage shift may change accordingly.

BRIEF DESCRIPTION OF THE DRAWINGS

The features and advantages of the various embodiments will become apparent from the following detailed description in which.

DETAILED DESCRIPTION

Transistors may be used in circuits for many purposes and the circuits may be designed to operate in many different ways. For example, the circuits may be designed to work with high or low voltages, may be designed for high or low swings (difference between upper and lower value), may be designed to work near a saturation region or in the saturation region. Often the swing of a signal is sufficient but the upper or lower parameters of the signals need to be adjusted. For example, the signal may need to be shifted up or down so that a transistor receiving the signal operates in the saturation region.

Shifting a signal entails maintaining the swing (absolute voltage drop) of the signal while moving upper and lower limits of the signal. For example, a signal ranging from 0.5V to 4.5V would have a swing of 4.0V and could be shifted up 0.5V so that the range of the signal was from 1.0V to 5.0V and still had a swing of 4.0V. The reasons that a signals need to be shifted can vary.

A signal may be shifted to account for differences between an ideal signal and a generated signal. That is, the generated signal may not meet the parameters of the ideal signal and may need to be shifted up or down to ensure a particular parameter is met. Using the example above, the 0.5V to 4.5V signal may be the actual signal generated for an ideal 0.0V to 5.0V signal. A circuit receiving the signal may be triggered by an upper or lower value of the ideal signal so the signal may be shifted up or down based on parameters associated with the circuit receiving the signal.

Figure 1A:
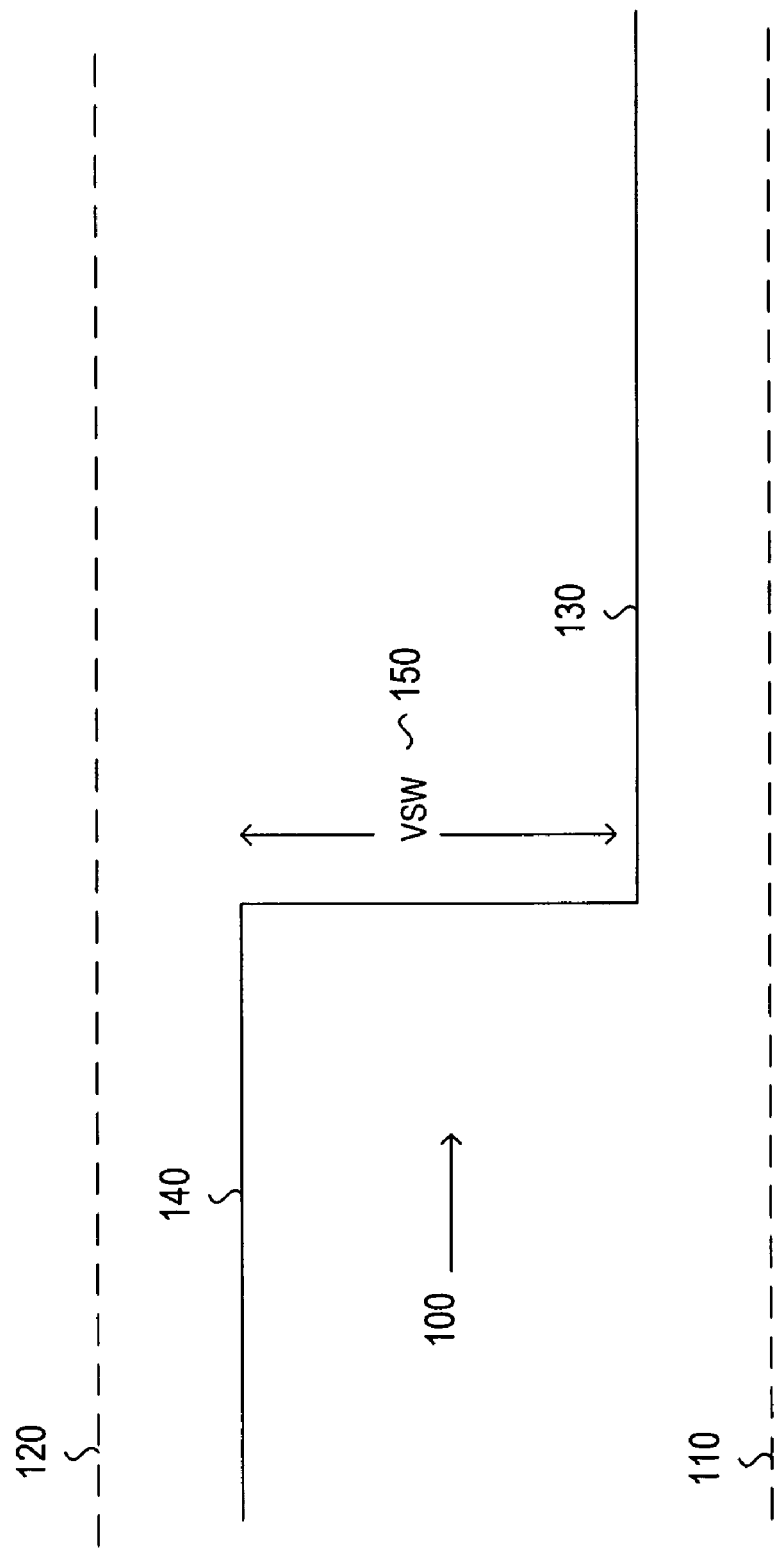
FIG. 1A illustrates an exemplary comparison of ideal signal values versus an incoming signal, according to one embodiment.

FIG. 1A illustrates an exemplary comparison of ideal signal values versus an exemplary incoming signal 100. The ideal values include a lower value 110 ($V_{IL}$) and an upper value 120 ($V_{IH}$). The incoming signal 100 also has a lower value 130 ($V_{RL}$) and an upper value 140 ($V_{RH}$). However, the $V_{RL}$ 130 may not be as low as the $V_{IL}$ 110 and the $V_{RH}$ 140 may not be as high as the $V_{IH}$ 120. For example, ideal signal values may include a $V_{IL}$ 110 of 0.0 V and a $V_{IH}$ 120 of 5.0 V, while an incoming signal may have a $V_{RL}$ 130 of 0.2 V and a $V_{RH}$ 140 of 4.8 V. Ideal signal values of $V_{IL}$ 110=−2.5 V and $V_{IH}$ 120=2.5 V may have a $V_{RL}$ 130 of −2.3 V and a $V_{RH}$ 140 of 2.3 V. The swing ($V_{SW}$) 150 of the incoming signal 100 is from the $V_{RL}$ 130 to the $V_{RH}$ 140.

If a circuit is designed to perform (or for optimum performance) at an ideal signal value and the realistic value drifts to far from the ideal value, the performance of the circuit may be affected. For example, if a circuit is designed to be activated at a $V_{IL}$ 110 of 0.0V and the $V_{RL}$ 130 is 0.2 V, the operation of the circuit may be degraded in some fashion. The incoming signal 100 may be shifted down so that $V_{RL}$ 130 was closer to $V_{IL}$ 110. Likewise, if $V_{IH}$ 120 is critical to the operation of the circuit the incoming signal 100 may be shifted up prior to applying to the circuit.

Figure 1B:
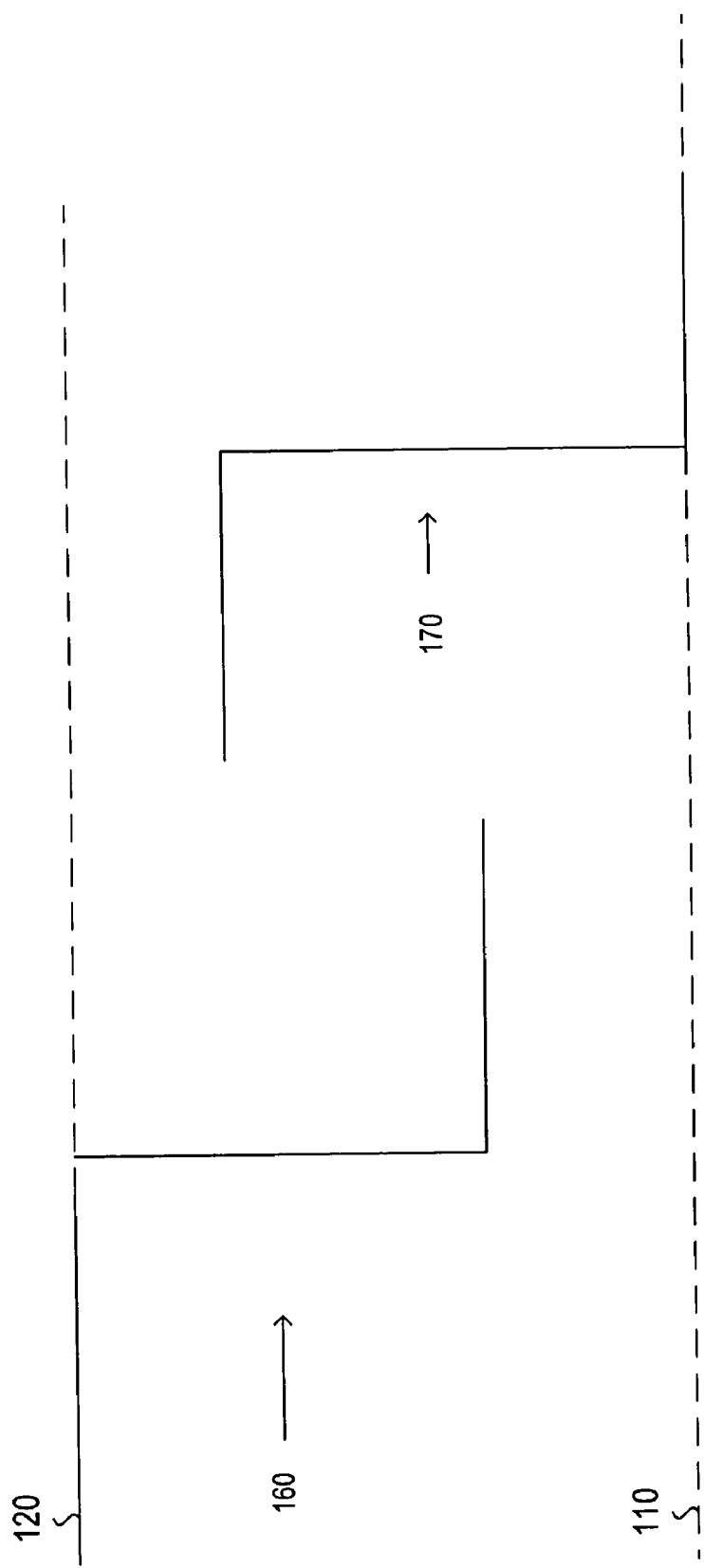
FIG. 1B illustrates exemplary shifted incoming signals, according to one embodiment.

FIG. 1B illustrates exemplary shifted incoming signals 160, 170. The incoming signal 160 has been shifted up so that an upper value ($V_{RHS}$) 180 it is at or near the $V_{IH}$ 120 and a lower value ($V_{RLS}$) 185 is accordingly shifted up an equal amount. The incoming signal 170 has been shifted down so that a lower value ($V_{RLS}$) 190 it is at or near the $V_{IL}$ 110 and an upper value ($V_{RHS}$) 195 is accordingly shifted down an equal amount. For example, an incoming signal having a $V_{RL}$ 130 of 0.2 V and a $V_{RH}$ 140 of 4.8 V may be shifted down by 0.2 V so that the $V_{RLS}$ 190 becomes 0.0 V (equal to $V_{IL}$ 110) and the $V_{RHS}$ 195 becomes 4.6 V or may be shifted up by 0.2 V so that the $V_{RLS}$ 185 becomes 0.4 V and the $V_{RHS}$ 180 becomes 5.0 V (equal to $V_{IH}$ 120). An incoming signal having a $V_{RL}$ 130 of −2.3 V, and a $V_{RH}$ 140 of 2.3 V may be shifted down by 0.2 V so that the $V_{RLS}$ 190 becomes −2.5 V (equal to $V_{IL}$ 110) and the $V_{RHS}$ 195 becomes 2.1 V or may be shifted up by 0.2 V so that the $V_{RLS}$ 185 becomes −2.1 V and the $V_{RHS}$ 180 becomes 2.5 V (equal to $V_{IH}$ 120).

A signal having a particular swing may be shifted so that it can be used at a different offset voltage (voltage around which the signal is centered). For example, a signal having a particular swing and offset voltage may be shifted up or down so that it can be used more efficiently by another circuit. For example, if a signal has an offset voltage of 1.0V and a swing of 0.4V (range from 0.8 to 1.2V) and another circuit operates most efficiently with an offset voltage of 5.0V the signal may be shifted up 4.0V so that the offset is 5.0V and the signal ranges from 4.8 to 5.2V.

Figure 2:
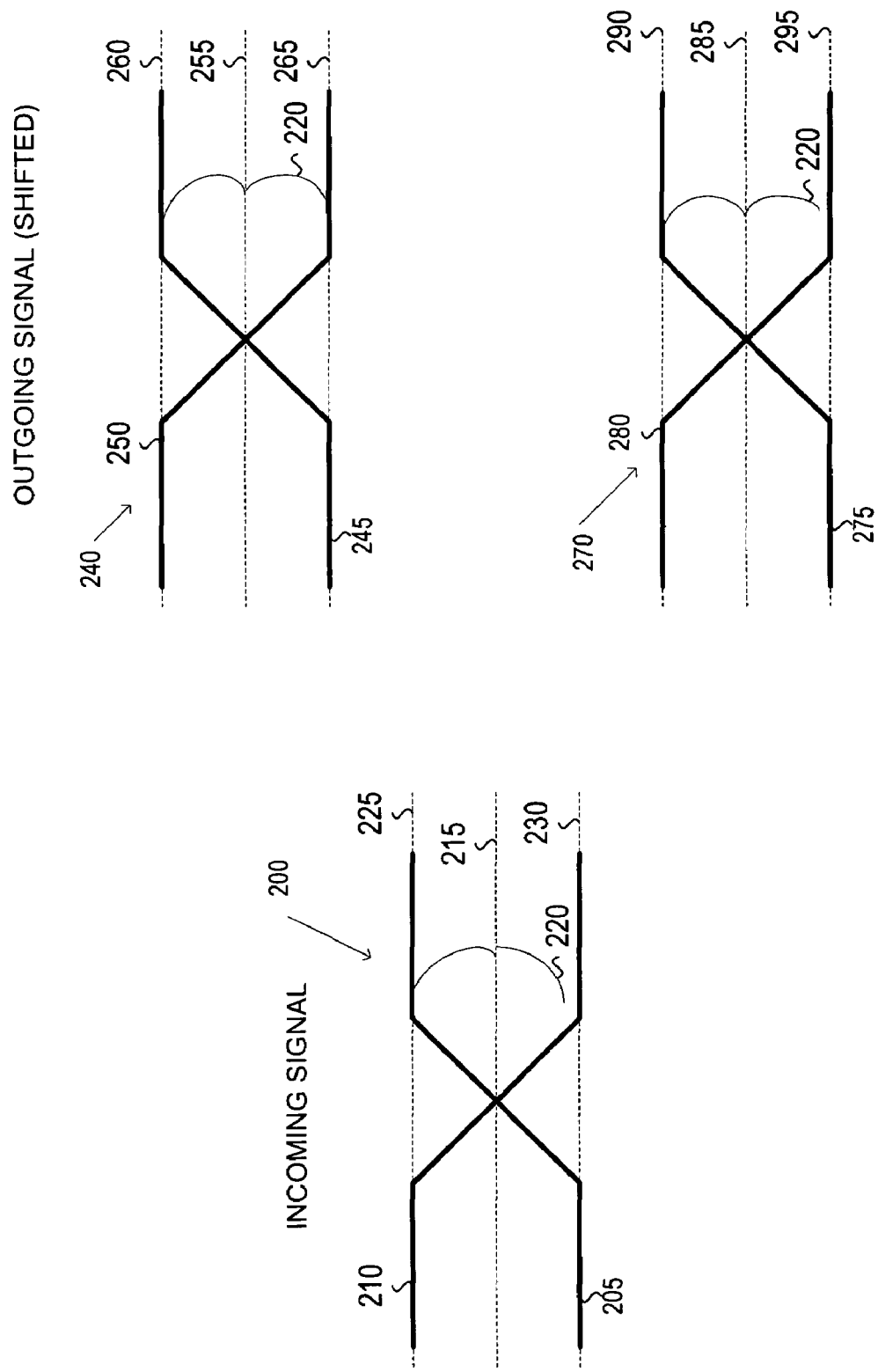
FIG. 2 illustrates an exemplary differential signal and shifted versions thereof, according to one embodiment.

FIG. 2 illustrates an exemplary differential signal 200 and shifted versions 240, 270 thereof. Each of the differential signal 200, 240, 270 includes $V_{Diff-}$ 205, 245, 275 and $V_{Diff+}$ 210, 250, 280 (the compliment of $V_{Diff-}$ 205, 245, 285). The differential signal 200 is centered around an offset voltage $V_{Off}$ 215 and has a voltage swing ($V_{SW}$) 220. Accordingly, the $V_{Diff-}$ 205 and $V_{Diff+}$ 210 range from a high voltage ($V_H$) 225 ($V_{Off}$ 215+$V_{SW/2}$) to a low voltage ($V_L$) 230 ($V_{Off}$ 215-$V_{SW/2}$). The shifted signal 240 is shifted up by $V_{UP}$ so that it centered around an offset voltage $V_{Off}$ 255 ($V_{Off}$ 215+$V_{UP}$) but still has the same $V_{SW}$ 220. Accordingly, the $V_{Diff-}$ 245 and $V_{Diff+}$ 250 range from a $V_H$ 260 ($V_{Off}$ 255+$V_{SW/2}$) to a $V_L$ 265 ($V_{Off}$ 255-$V_{SW/2}$). The shifted signal 270 is shifted down by $V_{DOWN}$ so that it centered around an offset voltage $V_{Off}$ 285 ($V_{Off}$ 215-$V_{DOWN}$) but still has the same $V_{SW}$ 220. Accordingly, the $V_{Diff-}$ 275 and $V_{Diff+}$ 280 range from a $V_H$ 290 ($V_{Off}$ 285+$V_{SW/2}$) to a $V_L$ 295 ($V_{Off}$ 285-$V_{SW/2}$).

For example, signals 205, 210 having a $V_{Off}$ 215 of 2.5V and a $V_{SW}$ 220 of 1.0 V (range from 2.0V to 3.0V) may be shifted up by 2.0V so that signals 245, 250 have a $V_{Off}$ 255 of 4.5V and range from 4.0V to 5.0V. Likewise, the signals 205, 210 may be shifted down 2.0V so that signals 275, 280 have a $V_{Off}$ 285 of 1.0V and range from 0.0V to 1.0V. As noted, the $V_{SW}$ 220 stays the same when the signal is shifted, regardless of it is shifted up or down.

Figure 3:
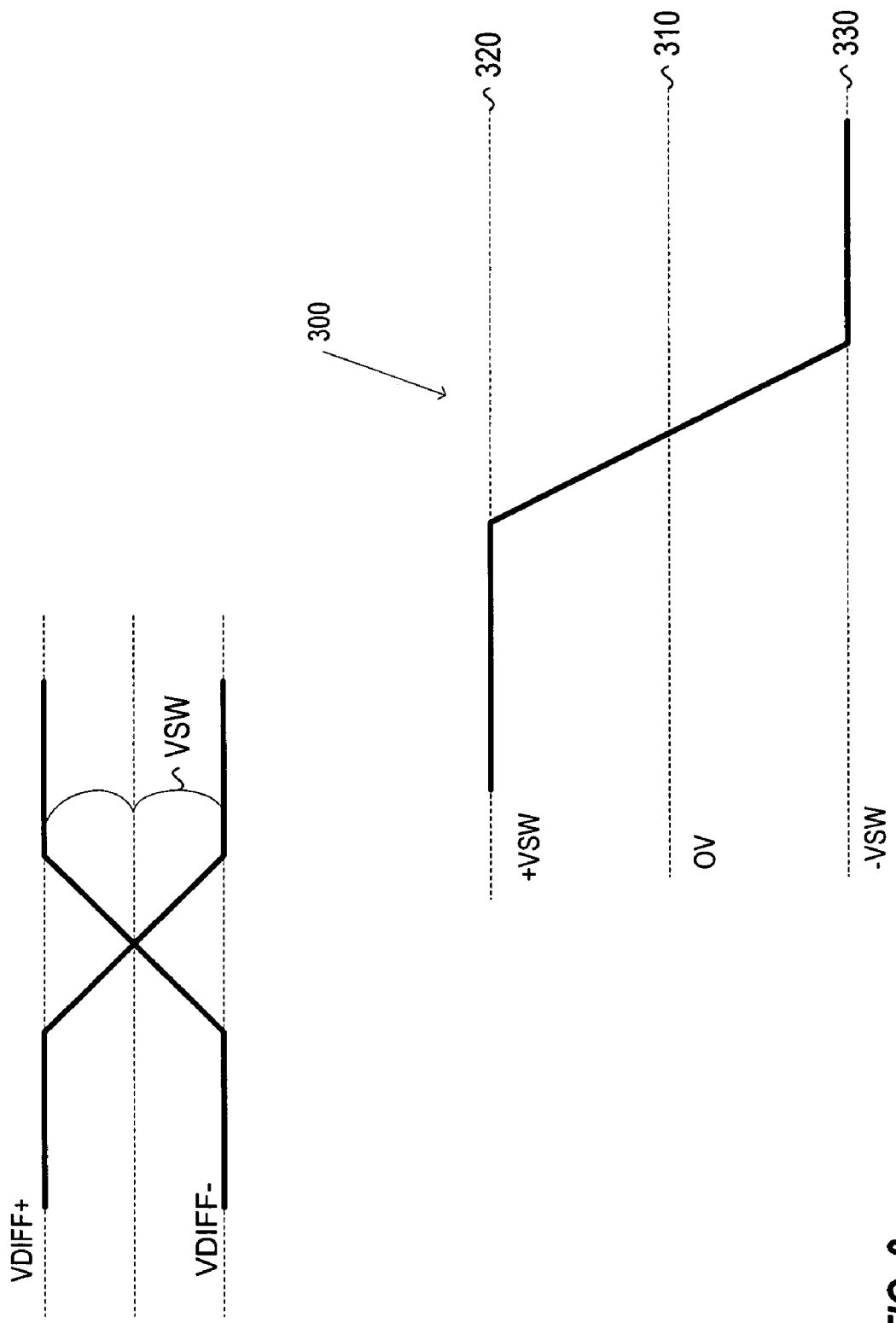
FIG. 3 illustrates an exemplary net differential input signal, according to one embodiment.

FIG. 3 illustrates an exemplary net differential input signal 300. The signal 300 is the same before and after being shifted (either up or down). The net differential signal 300 is the difference between the two signals making up the differential signal ($V_{Diff+}$-$V_{Diff-}$). Accordingly, the net differential signal 300 has a $V_{Off}$ 310 of 0.0V when the $V_{Diff+}$ and the $V_{Diff-}$ cross. The net differential signal 300 ranges from a $V_H$ 320 of +$V_{SW}$ to a $V_L$ 330 of −$V_{SW}$. For the example noted directly above, the net differential signal 300 for the incoming signal and each of the shifted signals would have the $V_{Off}$ 310 of 0.0V and range from a $V_H$ 320 of 1.0V to a $V_L$ 330 of −1.0V.

Figure 4A:
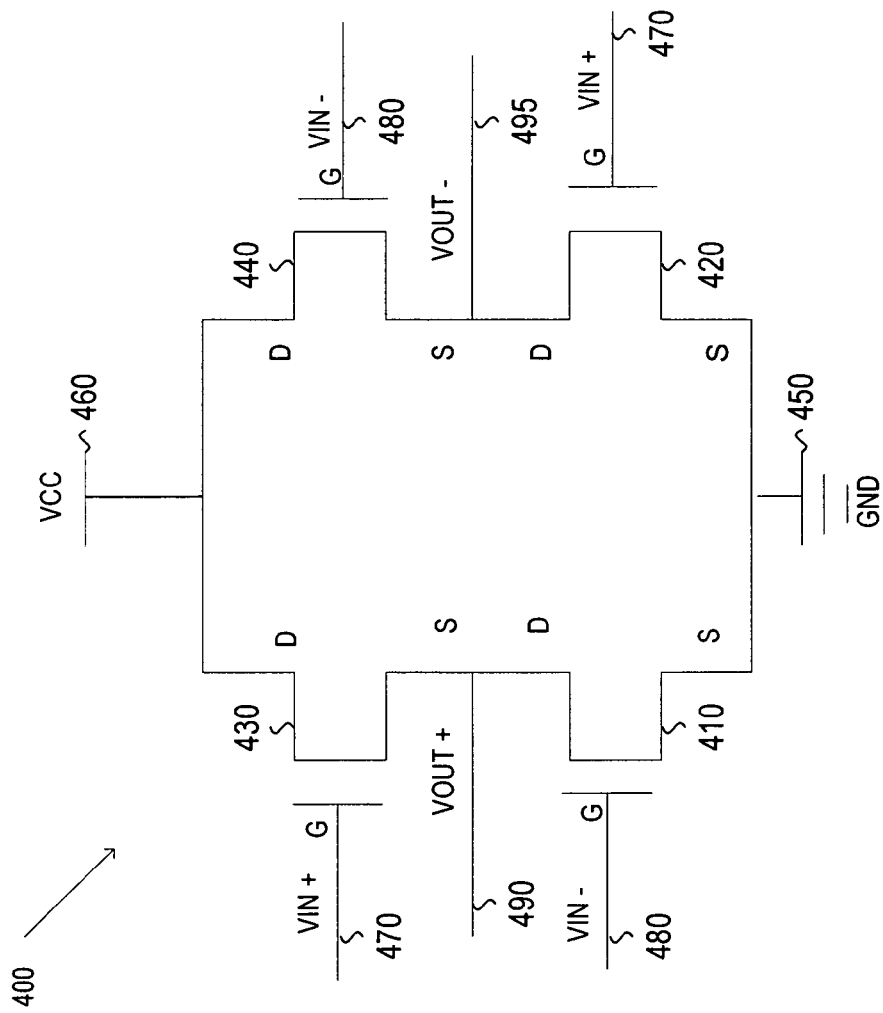
FIG. 4A illustrates an exemplary level shifter for a differential input signal that is always high, according to one embodiment.

FIG. 4A illustrates an exemplary level shifter 400 for a differential signal, wherein each leg of the differential signal is always high. The level shifter 400 includes four NMOS transistors 410, 420, 430, 440. All NMOS transistors 410, 420, 430, 440 are used because the incoming signal is always high and would not activate a PMOS transistor. The transistors 410, 420 have their sources tied to GND 450 and the transistors 430, 440 have their drains tied to $V_{CC}$ 460. The drains of transistors 410, 420 are tied to the sources of transistors 430, 440 respectively. A gate of the transistors 420, 430 receive a first leg of the differential input signal ($V_{IN+}$) 470 and a gate of the transistors 410, 440 receive a second leg ($V_{IN-}$) 480, that is the compliment of the $V_{IN+}$ 470. The transistors 410, 430 in combination with one another produce a first leg of the differential output signal ($V_{OUT+}$) 490. The transistors 420, 440 in combination with one another produce a second leg ($V_{OUT-}$) 495 that is the compliment of the $V_{OUT+}$ 490.

The transistors 420, 430 are turned ON when the $V_{IN+}$ 470 is at or near it's high point ($V_{CC}$ 460) and $V_{IN-}$ 480 is at or near it's low point ($V_{CC}$ 460-$V_{SW}$). The transistors 410, 440 are turned ON when the $V_{IN-}$ 480 is high and the $V_{IN+}$ 470 is low. The fact that the transistors 430, 440 are NMOS means that there will a voltage drop $V_t$) across the transistors 430, 440 when the transistor 430, 440 are ON. Accordingly, the transistors 430, 440 will not pass $V_{CC}$ but instead will pass $V_{CC}$-$V_t$. Accordingly, $V_{OUT+}$ 490 and $V_{OUT-}$ 495 will at a minimum be shifted down by $V_t$ so that they range between $V_{CC}$-$V_t$ and $V_{CC}$-$V_t$-$V_{SW}$. By varying the relative size of the transistors 430, 440 with respect to the transistor 410, 420, the offset voltage of the output signals 490, 495 can be shifted down further with respect to the input signals 470, 480. The output signals 490, 495 could be possibly be shifted down a maximum amount so that they range from GND to GND+$V_{SW}$.

Figure 4B:
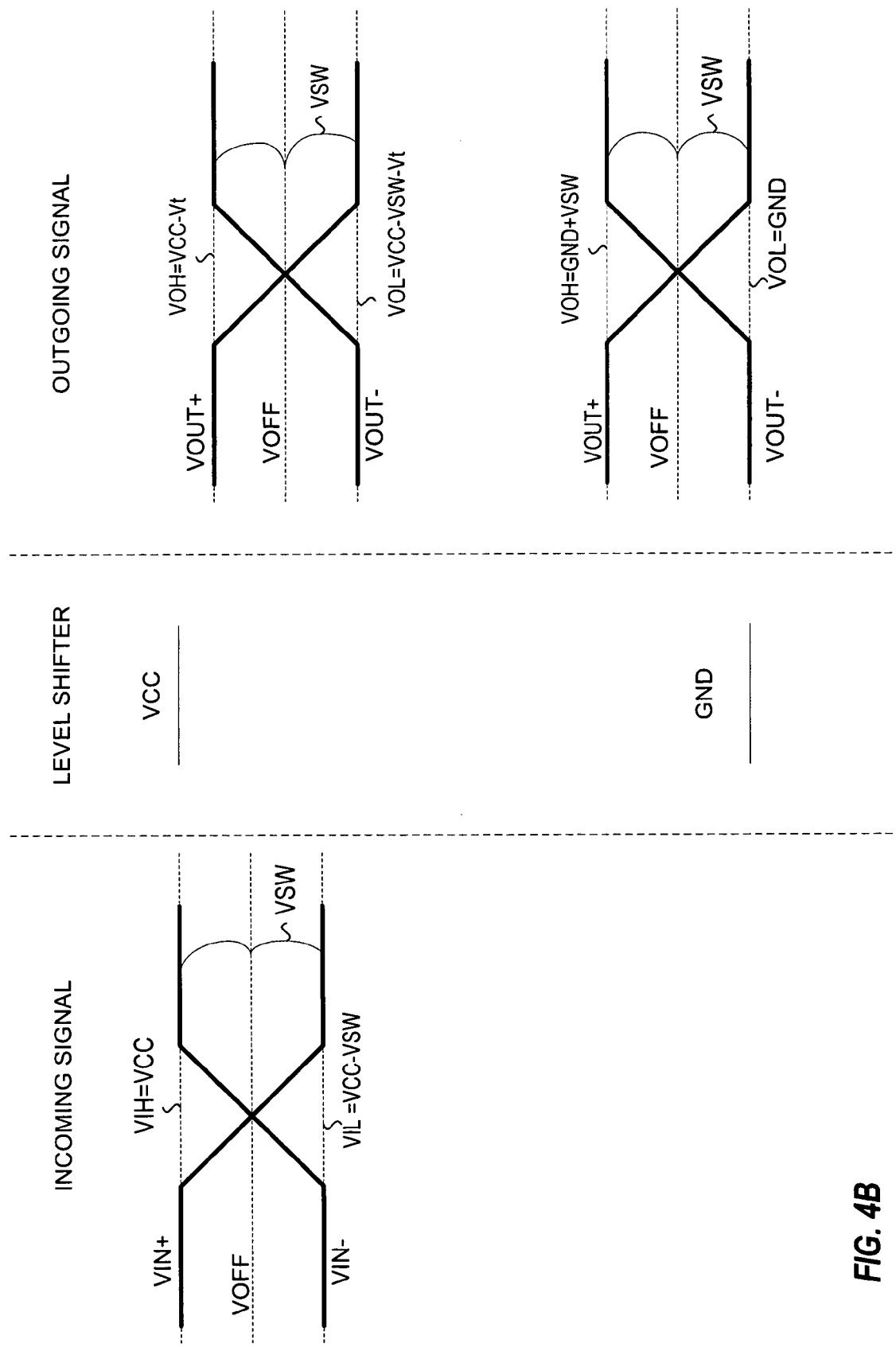
FIG. 4B illustrates exemplary differential input voltage signals being shifted by the level shifter of FIG. 4A, according to one embodiment.

FIG. 4B illustrates an exemplary differential input voltage signal being shifted by a level shifter (e.g., level shifter 400 of FIG. 4A). Each leg of the input signals includes a high voltage ($V_{IH}$), a low voltage ($V_{IL}$) and a voltage swing ($V_{SW}$) therebetween. The $V_{IH}$ is equal to $V_{CC}$ and the $V_{IL}$ is equal to $V_{CC}$-$V_{SW}$. The input signals are provided to the level shifter 400 that has the upper voltage ($V_{CC}$) 460 and the lower voltage (GND) 450. The output signals maintain the same $V_{SW}$ as the received signals 470, 480 however upper and lower values of the output signals ($V_{OH}$, $V_{OL}$) can be varied between $V_{CC}$-$V_t$ and GND. That is, the output signals can be shifted up down a minimum amount so that $V_{OH}$ is equal to $V_{CC}$-$V_t$ and the $V_{OL}$ is equal to $V_{CC}$-$V_t$-$V_{SW}$. Likewise, the output signals can be shifted down a maximum amount until the $V_{OL}$ is equal to the GND and the $V_{OH}$ is equal to GND+$V_{SW}$.

For example, assume the incoming signals had a $V_{IH}$ of 3.5V, a $V_{IL}$ of 2.5V, and the transistors 430, 440 have a $V_t$ of 0.2V. The incoming signals can be shifted down a minimum amount of $V_t$ so that the output signals swing between 2.3V and 3.3V, a maximum amount so that the output signals range between 0.0V and 1.0V, or anywhere in between.

The level shifter 400 takes in a low-swing differential signal, and outputs a level-shifted version of that signal. The output signal can drive large capacitive loads and the signal swing is very accurately buffered. The level-shifter 400 may be used in CML circuits. While CML logic signals typically operate at signal swings of $V_{CC}$ to $V_{CC}$-$V_{SW}$, in certain situations they operate better when the clock signals are shifted down so that transistors can operate in the saturation region. The level shifter 400 shifts down the signal, while maintaining the signal's swing, and consuming less power than other types of buffers. The level shifter 400 is useful in circuits which are implemented using CML logic.

Figure 5:
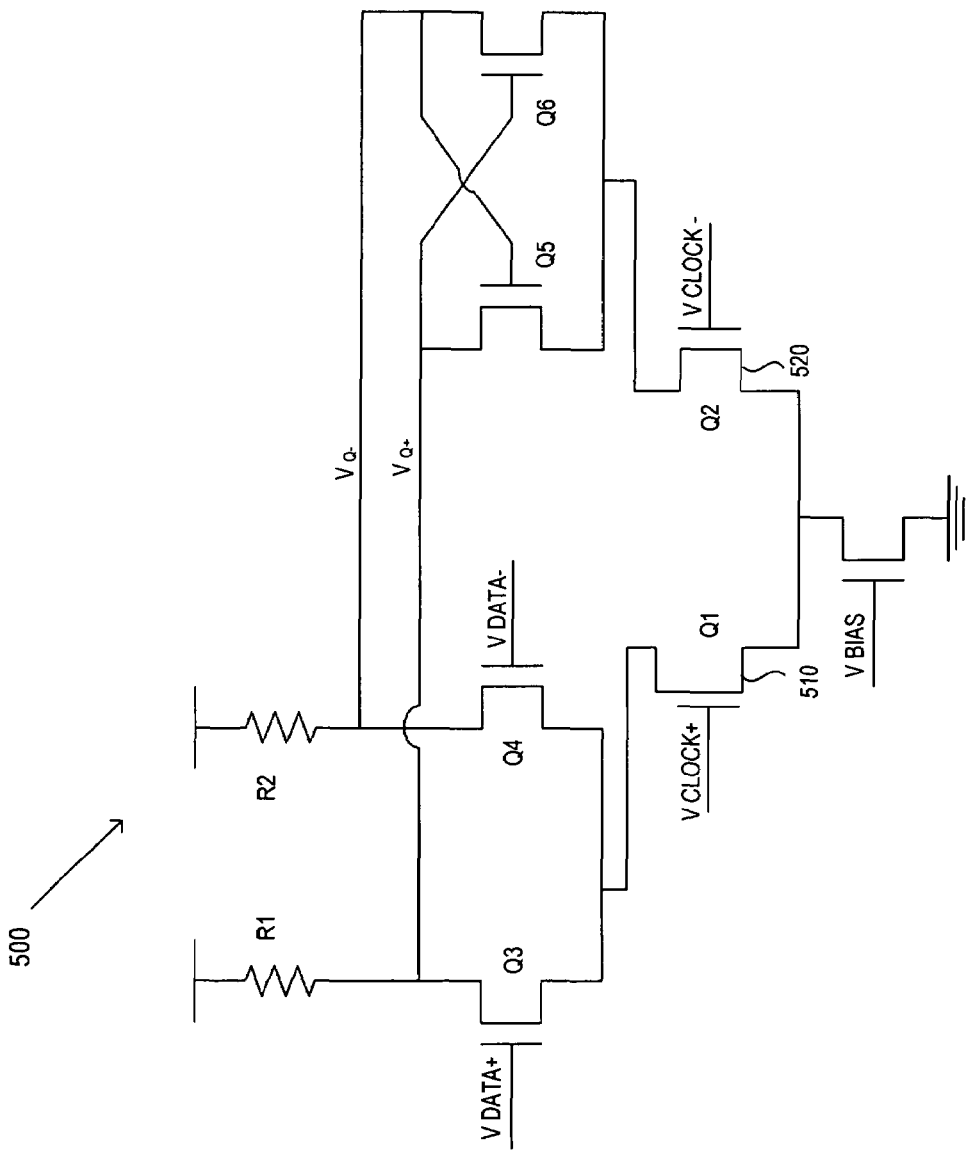
FIG. 5 illustrates an exemplary CML D-latch, according to one embodiment.

FIG. 5 illustrates an exemplary CML D-latch 500. The CML D-latch 500 includes transistors 510, 520 for receiving a differential clock signal. The clock signals received by the transistors 510, 520 typically operate at signal swings of $V_{CC}$ to $V_{CC}$-$V_{SW}$. However, the circuit 500 operates better when the clock signals are shifted down so that the transistors 510, 520 operate in the saturation region. A low swing level-shifter (e.g., 400 of FIG. 4A) would be placed before the circuit 500 in order to lower the offset of the clock signal, and hence enable the D-latch to operate better.

Figure 6A:
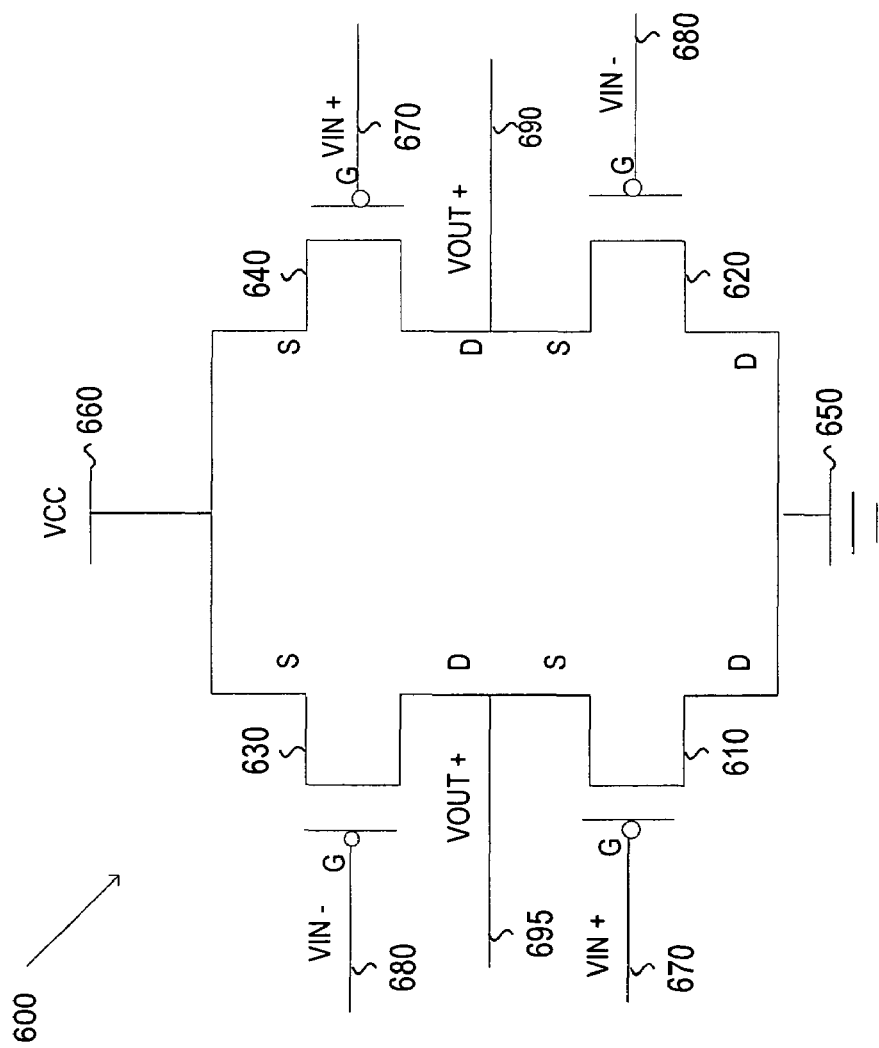
FIG. 6A illustrates an exemplary level shifter for a differential input signal that is always low, according to one embodiment.

FIG. 6A illustrates an exemplary level shifter 600 for a differential signal, wherein each leg of the differential signal is always low. The level shifter 600 includes four PMOS transistors 610, 620, 630, 640. The PMOS transistors 610, 620, 630, 640 are used because the incoming signal maintains is always low and would not activate an NMOS transistor. The transistors 610, 620 have their drains tied to GND 650 and the transistors 630, 640 have their sources tied to $V_{CC}$ 660. The transistors 610, 620 have their sources tied to drains of the transistors 630, 640 respectively. A gate of the transistors 610, 640 receive a first input ($V_{IN+}$) 670 and a gate of the transistors 620, 630 receive a second input ($V_{IN-}$) 680, that is the compliment of the $V_{IN+}$ 670. The transistors 620, 640 in combination with one another produce a first output ($V_{OUT+}$) 690. The transistors 610, 630 in combination with one another produce a second output ($V_{OUT-}$) 695 that is the compliment of the $V_{OUT+}$ 690.

The transistors 610, 640 are turned ON when the $V_{IN+}$ 670 is at or near it's low point (GND 650) and $V_{IN-}$ 680 is at or near it's high point (GND 650+$V_{SW}$). The transistors 620, 630 are turned ON when the $V_{IN-}$ 680 is low and the $V_{IN+}$ 670 is high. The fact that the transistors 610, 620 are PMOS means that there will a voltage drop ($V_t$) across the transistors 610, 620 when the transistor 610, 620 are ON. Accordingly, the transistors 610, 620 will not pass GND but instead will pass GND+$V_t$. Accordingly, $V_{OUT+}$ 690 and $V_{OUT-}$ 695 will at a minimum be shifted up by $V_t$ so that they range between GND+$V_t$ and GND+$V_t$+$V_{SW}$. By varying the relative size of the transistors 630, 640 with respect to the transistor 610, 620, the offset voltage of the output signals 690, 695 can be shifted up further with respect to the input signals 670, 680. The output signals 690, 695 could possibly be shifted up a maximum amount so that they range from $V_{cc}$ to $V_{CC}$-$V_{SW}$.

Figure 6B:
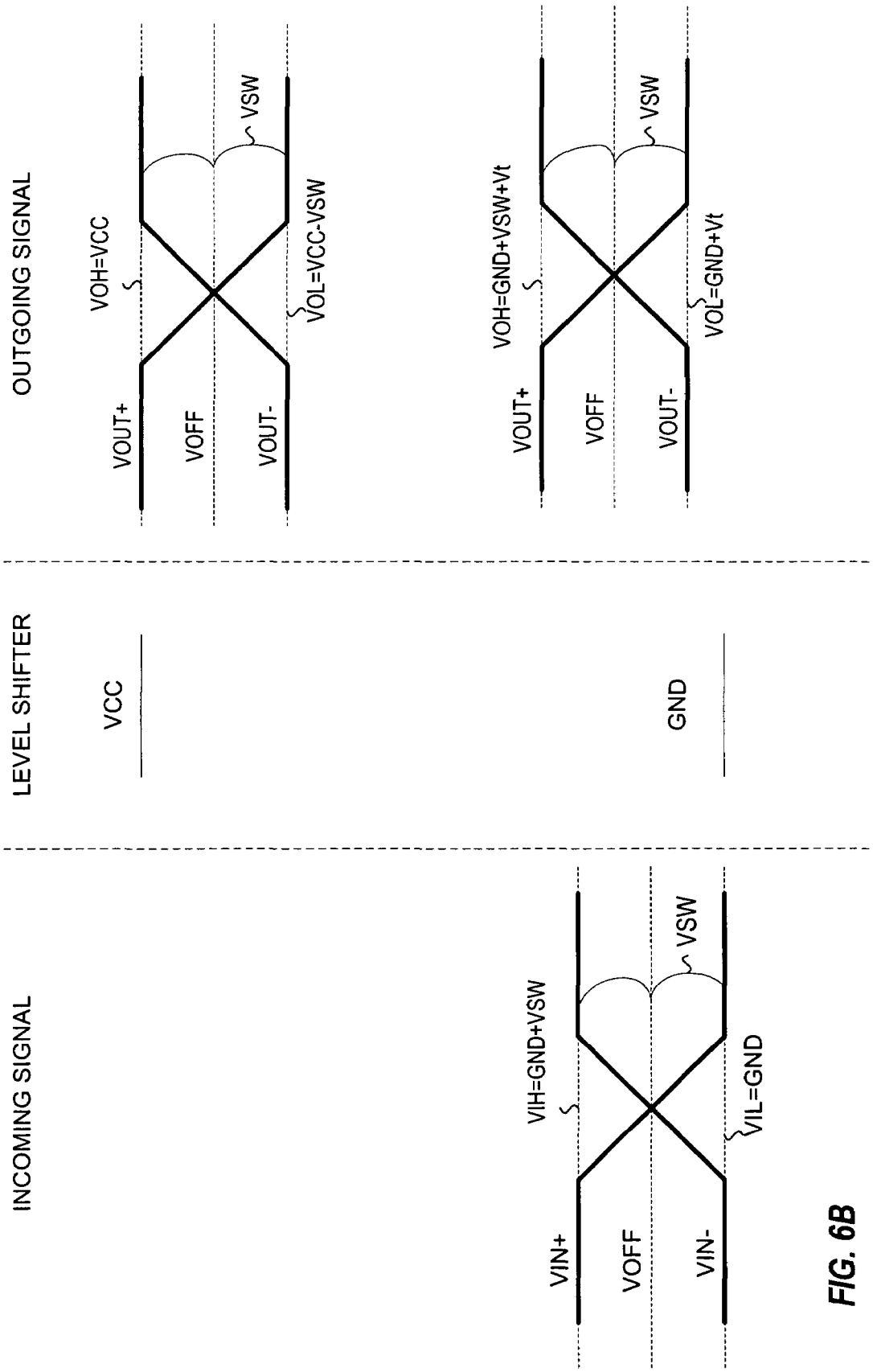
FIG. 6B illustrates exemplary differential input voltage signals being shifted by the level shifter of FIG. 6A, according to one embodiment.

FIG. 6B illustrates an exemplary differential input voltage signal being shifted by a level shifter (e.g., level shifter 600 of FIG. 6A). Each of the input signals 670, 680 includes a high voltage ($V_{IH}$) and a low voltage ($V_{IL}$) and a voltage swing ($V_{SW}$) therebetween. The input signals 670, 680 are provided to the level shifter 600 that has the upper voltage ($V_{CC}$) 660 and the lower voltage (GND) 650. The output signals 690, 695 will maintain the same $V_{SW}$ as the received signals 670, 680 however upper and lower values of the output signals ($V_{OH}$, $V_{OL}$) can be varied between the $V_{DD}$ and the GND+$V_t$. That is, the output signals 690, 695 can be shifted up until the $V_{OH}$ is equal to $V_{DD}$ and the $V_{OL}$ is equal to $V_{DD}$-$V_{SW}$. Likewise, the output signals 690, 695 can be shifted down until the $V_{OL}$ is equal to the GND+$V_t$ and the $V_{OH}$ is equal to GND+$V_{SW}$+$V_t$.

For example, assume the incoming signals had a $V_{IH}$ of 1.0V, a $V_{IL}$ of 0.0V, $V_{CC}$ is 3.5V and the transistors 610, 620 had a $V_t$ of 0.2V. The incoming signals can be shifted up a minimum amount of $V_t$ so that the output signals swing between 0.2V and 1.2V, a maximum amount so that the output signals range between 2.5V and 3.5V, or anywhere in between.

The various embodiments described herein could be utilized in a computer system. As one skilled in the art would recognize a computer system includes processor(s) and memory and may interface to periphery, networks, the Internet, and other computer systems. The computer system may include a single die with the processor(s) and memory or may include a processor die and off die memory (e.g., a memory die). The various embodiments may be implemented as part of the memory or part of the processor(s).

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. An apparatus comprising two parallel stacks of transistors, coupled between two voltage sources, to receive a differential voltage input signal and generate a differential voltage output signal, wherein the two parallel stacks include a first stack of transistors includes a first transistor coupled to a first voltage source and receiving a first leg of a differential voltage input signal and a second transistor coupled to a second voltage source and receiving a second leg of the differential voltage input signal, wherein the first stack generates a first leg of a differential voltage output signal; and a second stack of transistors including a third transistor coupled to the first voltage source and receiving the second leg of the differential voltage input signal and a fourth transistor coupled to the second voltage source and receiving the first leg of the differential voltage input signal, wherein the second stack generates a second leg of the differential voltage output signal, wherein the differential voltage output is a shifted down version of the differential voltage input signal and has substantially same swing as the differential voltage input signal, wherein the down shift is at least a threshold voltage associated with the transistors, wherein the first leg of the differential voltage output signal is the first leg of the differential voltage input signal minus at least the threshold voltage of the first transistor and the second leg of the differential output voltage signal is the second leg of the differential input signal minus at least the threshold voltage of the third transistor, and wherein the differential voltage output signal is shifted further downward based on ratio of widths of the second and the fourth transistors to the first and the third transistors respectively.

2. The apparatus of claim 1, wherein the downshift is independent of load the differential voltage output signal is applied to.

* * * * *